US010002797B1

(12) United States Patent
Pandey

(10) Patent No.: US 10,002,797 B1
(45) Date of Patent: Jun. 19, 2018

(54) CHIP INTEGRATION INCLUDING VERTICAL FIELD-EFFECT TRANSISTORS AND BIPOLAR JUNCTION TRANSISTORS

(71) Applicant: GLOBALFOUNDRIES Inc., Grand Cayman (KY)

(72) Inventor: Shesh Mani Pandey, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/420,794

(22) Filed: Jan. 31, 2017

(51) Int. Cl.
*H01L 21/8249* (2006.01)
*H01L 27/06* (2006.01)
*H01L 29/732* (2006.01)
*H01L 29/78* (2006.01)
*H01L 29/73* (2006.01)
*H01L 29/66* (2006.01)

(52) U.S. Cl.
CPC ...... *H01L 21/8249* (2013.01); *H01L 27/0623* (2013.01); *H01L 29/66272* (2013.01); *H01L 29/732* (2013.01); *H01L 29/7317* (2013.01); *H01L 29/7827* (2013.01); *H01L 29/66666* (2013.01)

(58) Field of Classification Search
CPC ......... H01L 21/8249; H01L 21/823821; H01L 27/0623; H01L 27/0924; H01L 29/732; H01L 29/7827; H01L 29/66272; H01L 29/66666; H01L 29/785; H01L 29/66265; H01L 29/7317
See application file for complete search history.

(56) References Cited

U.S. PATENT DOCUMENTS

| 6,790,722 B1* | 9/2004 | Divakaruni et al. ............... H01L 21/8249 257/E21.372 |
| 9,263,583 B2 | 2/2016 | Cai et al. |
| 2015/0287650 A1* | 10/2015 | Chang et al. ......... H01L 21/225 438/236 |
| 2017/0162559 A1* | 6/2017 | Lesenco ............. H01L 27/0623 |

OTHER PUBLICATIONS

Joodaki, et al., "Technological requirements for a self-aligned lateral SiGe HBT with the SiGe layer formed by Ge ion implantation in Si including theoretical performance", 8th International Conference on Solid-State and Integrated Circuit Technology, 2006.

* cited by examiner

*Primary Examiner* — Michael Trinh
(74) *Attorney, Agent, or Firm* — Thompson Hine LLP; Francois Pagette

(57) ABSTRACT

Device structures and fabrication methods for a BiCMOS integrated circuit. A first fin and a second fin are formed on a semiconductor substrate. A gate electrode of a vertical field effect transistor is formed in association with the first fin. An emitter of a bipolar junction transistor is formed with an epitaxial growth process on the second fin, and a first source/drain region of the vertical field-effect transistor is concurrently formed with the epitaxial growth process on the first fin. The gate electrode and the first fin are arranged in a vertical direction between the source/drain region and the semiconductor substrate. The second fin is arranged in the vertical direction between the emitter and the semiconductor substrate.

19 Claims, 6 Drawing Sheets

CHIP INTEGRATION INCLUDING VERTICAL FIELD-EFFECT TRANSISTORS AND BIPOLAR JUNCTION TRANSISTORS

BACKGROUND

The invention relates generally to semiconductor device and integrated circuit fabrication and, in particular, to device structures and fabrication methods for a BiCMOS integrated circuit.

Traditional complementary metal-oxide-semiconductor (CMOS) structures for a field-effect transistor include a source, a drain, a channel situated between the source and drain, and a gate electrode configured to respond to a gate voltage by selectively connecting the source and drain to each other through the channel. Field-effect transistor structures can be broadly categorized based upon the orientation of the channel relative to a surface of a semiconductor substrate with which they are formed. In a vertical field-effect transistor, the direction of the gated current flow in the channel between the source and drain is generally perpendicular (i.e., vertical) to the substrate surface.

A bipolar junction transistor is a three-terminal electronic device that includes an emitter, an intrinsic base, and a collector in its construction. The intrinsic base is arranged between the emitter and collector in the structure of the device. In an NPN bipolar junction transistor, the emitter and collector may be composed of n-type semiconductor material, and the intrinsic base may be composed of p-type semiconductor material. In a PNP bipolar junction transistor, the emitter and collector may be composed of p-type semiconductor material, and the intrinsic base may be composed of n-type semiconductor material. In operation, the base-emitter junction is forward biased, the base-collector junction is reverse biased, and the collector-emitter current may be controlled by the base-emitter voltage.

A heterojunction bipolar transistor is a variant of a bipolar junction transistor in which at least two of the collector, emitter, and intrinsic base in the device structure are constituted by semiconductor materials with different energy bandgaps, which creates heterojunctions. For example, the collector and/or emitter of a heterojunction bipolar transistor may be constituted by silicon, and the base of a heterojunction bipolar transistor may be constituted by a silicon germanium (SiGe) alloy, which is characterized by a narrower band gap than silicon.

Bipolar junction transistors may be combined with field-effect transistors in a bipolar complementary metal-oxide-semiconductor (BiCMOS) integrated circuit. Such a chip integration can leverage the favorable characteristics of both transistor types.

Improved device structures and fabrication methods for a BiCMOS integrated circuit are needed.

SUMMARY

In an embodiment of the invention, a structure includes a vertical field-effect transistor and a bipolar junction transistor. The vertical field-effect transistor includes a first fin projecting from the semiconductor substrate, a gate structure overlapping a portion of the first fin that functions as a channel, a first source/drain region, and a second source/drain region. The gate structure is arranged in a vertical direction between the first source/drain region and the second source/drain region. The bipolar junction transistor includes a second fin projecting from the semiconductor substrate, a selectively implanted collector in the second fin, an emitter, and a base arranged in the vertical direction between the selectively implanted collector and the emitter.

In an embodiment of the invention, a method includes forming a first fin and a second fin on a semiconductor substrate, forming a gate electrode of a vertical field effect transistor in association with the first fin, and concurrently forming, with a first epitaxial growth process, an emitter of a bipolar junction transistor on the second fin and a first source/drain region of the vertical field-effect transistor on the first fin. The gate electrode and the first fin are arranged in a vertical direction between the source/drain region and the semiconductor substrate. The second fin is arranged in the vertical direction between the emitter and the semiconductor substrate.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
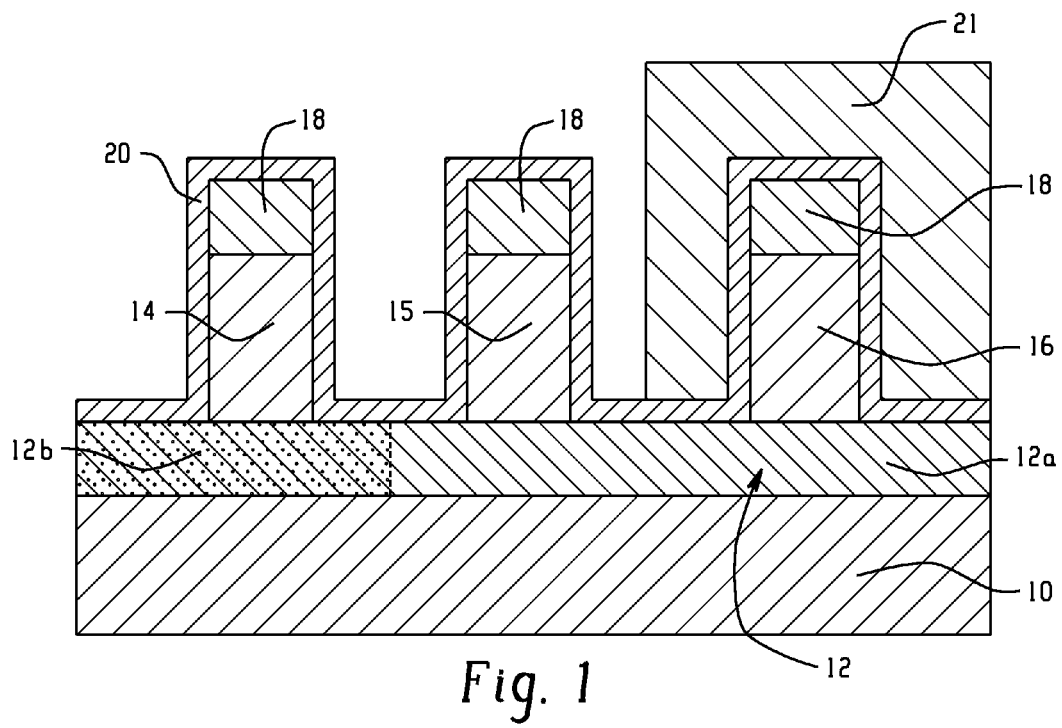
FIGS. 1-6 are cross-sectional views of a portion of a substrate at successive fabrication stages of a processing method for fabricating device structures in accordance with embodiments of the invention.

With reference to FIG. 1 and in accordance with an embodiment of the invention, a substrate 10 comprises a single-crystal semiconductor material usable to form the devices of an integrated circuit. For example, the substrate 10 may be comprised of a bulk wafer of a monocrystalline silicon-containing material, such as single-crystal silicon, or a device layer of a silicon-on-insulator wafer. An epitaxial layer 12 may be grown on the substrate 10 and may include an electrically-active dopant that alters its electrical properties. In an embodiment, the epitaxial layer 12 may be constituted by silicon, and may include a section 12a doped with an n-type dopant from Group V of the Periodic Table (e.g., phosphorus (P) or arsenic (As)) in a concentration that is effective to impart n-type conductivity and a section 12b doped with a p-type dopant from Group III of the Periodic Table (e.g., boron (B)) in a concentration that is effective to impart p-type conductivity.

Fins 14, 15, 16 are formed on a top surface the epitaxial layer 12. The fins 14, 15, 16, which are arranged in parallel rows, may be formed by patterning an epitaxial layer of intrinsic semiconductor material using photolithography and etching processes, such as a sidewall imaging transfer (SIT) process. Each of the fins 14, 15, 16 may be capped by a section of a hardmask layer 18 used during patterning. Fin 14 is located over, and projects from, section 12b of the epitaxial layer 12. Fins 15, 16 are located over, and project from, section 12a of the epitaxial layer 12. Fin 14 may be used for forming a p-type vertical field-effect transistor, fin 15 may be used for forming an n-type vertical field-effect transistor, and fin 16 may be used for forming a bipolar junction transistor, as described hereinafter.

A dielectric layer 20 may be formed on the fins 14, 15, 16 and the exposed top surface of the epitaxial layer 12. The dielectric layer 20 may be constituted by a dielectric material, such as silicon dioxide ($SiO_2$) that is deposited by CVD. A block mask 21 is formed that covers the fin 16 and the surface of the epitaxial layer 12 in the vicinity of fin 16.

Figure 2:
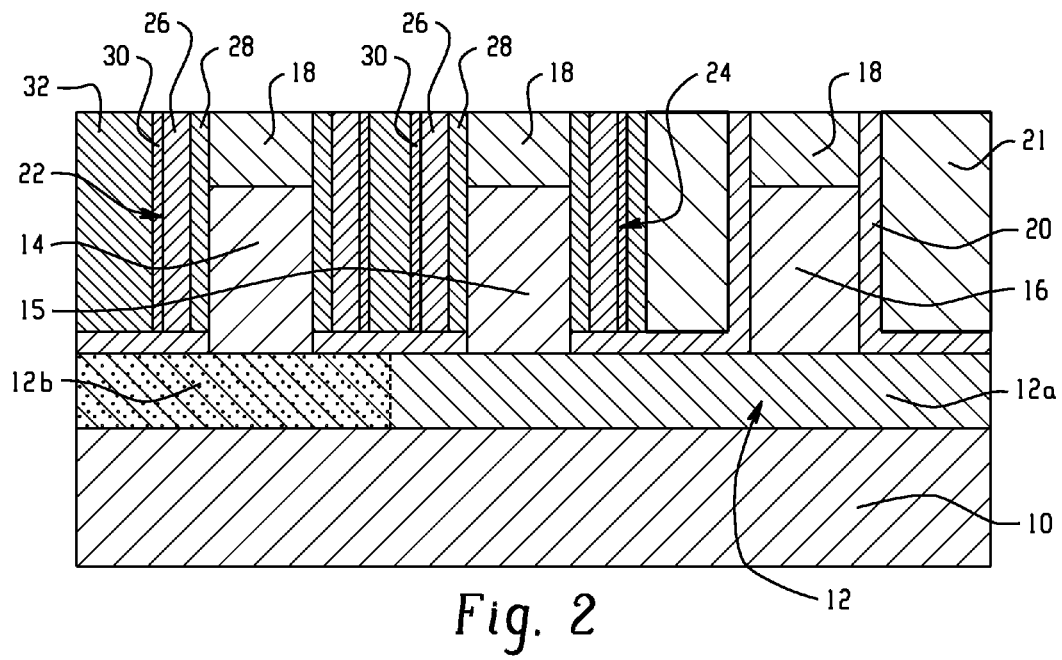

With reference to FIG. 2 in which like reference numerals refer to like features in FIG. 1 and at a subsequent fabrication stage, a gate electrode 22 is formed that surrounds a channel region of the fin 14 and a gate electrode 24 is formed that surrounds a channel region of the fin 15. The gate electrodes 22, 24 include a gate electrode layer 26 and a gate dielectric layer 28. The gate electrode layer 26 of each of the gate electrodes 22, 24 is comprised of one or more metals (e.g., titanium (Ti) and/or tungsten (W)) deposited by physical vapor deposition (PVD), CVD, etc. The gate dielectric layer 28 may be comprised of an electrical insulator, such as a high-k dielectric material like hafnium oxide or hafnium oxynitride, deposited by CVD, ALD, etc. Spacers 30 are formed by depositing a conformal layer of, for example, silicon dioxide ($SiO_2$) and etching with an anisotropic etching process, such as reactive ion etching (RIE), that preferentially removes the dielectric material of conformal layer from horizontal surfaces. An interlayer dielectric layer 32 is formed by fills the gaps around the fin 14. The interlayer dielectric layer 32 may be composed of a flowable oxide deposited by CVD.

Figure 3:
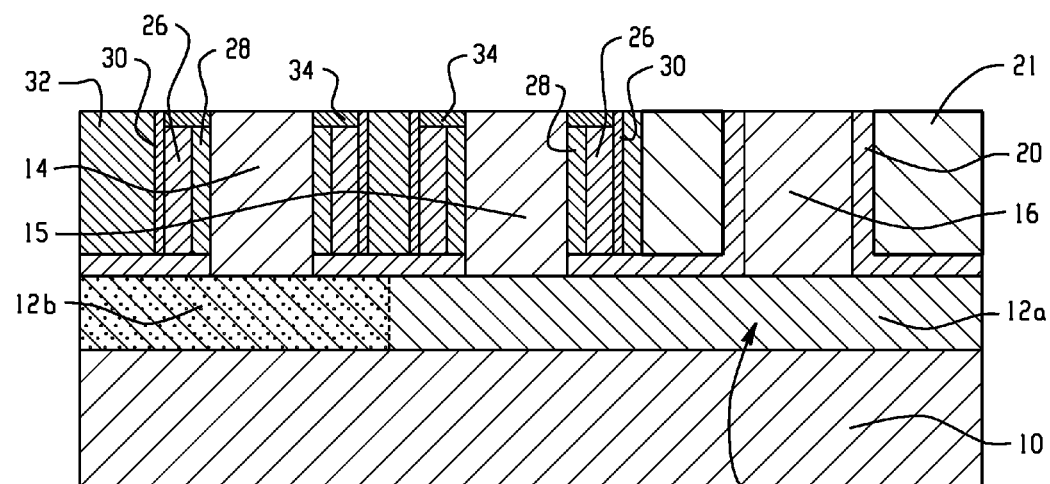

With reference to FIG. 3 in which like reference numerals refer to like features in FIG. 2 and at a subsequent fabrication stage, the gate electrodes 22, 24 may be recessed and the recessed space may be filled with a dielectric layer 34 constituted by a dielectric material, such as silicon dioxide ($SiO_2$) that is deposited by CVD. The sections of the hardmask layer 18 may be removed from the fins 14, 15, 16 by, for example, chemical mechanical polishing (CMP). The block mask 21 is likewise planarized when the sections of the hardmask layer 18 are removed.

Figure 4:
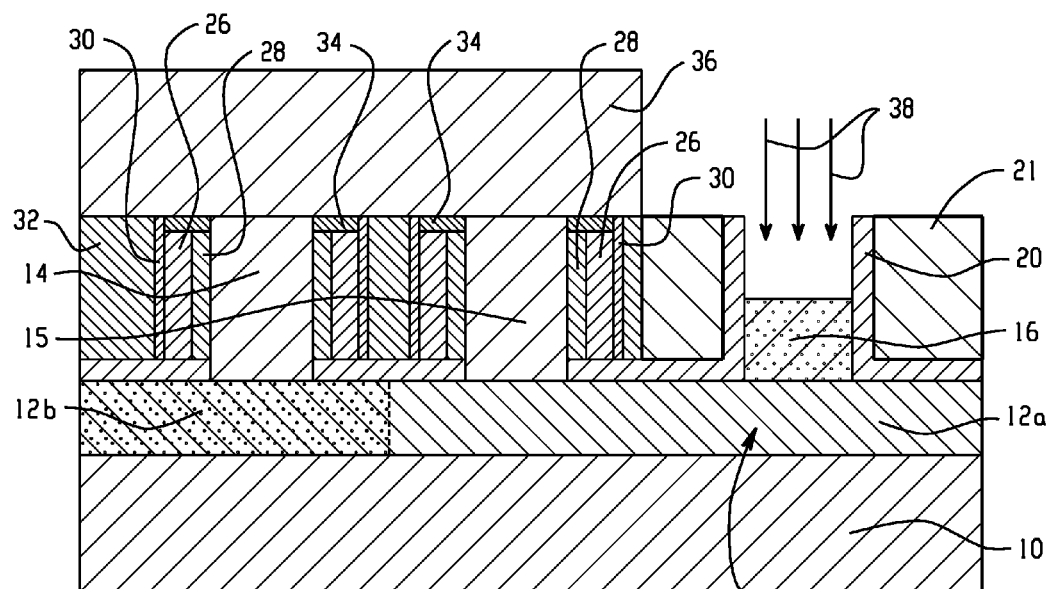

With reference to FIG. 4 in which like reference numerals refer to like features in FIG. 3 and at a subsequent fabrication stage, a block mask 36 is formed that covers the fins 14, 15 that have been partially processed to form field-effect transistors and the surface of the epitaxial layer 12 in the vicinity of the fins 14, 15. With the block mask 36 present, the fin 16 may be recessed relative to the fins 14, 15 and the surrounding sections of the dielectric layer 20 adjacent to the sidewalls of the fin 16. An etching process that is selective to the material of the dielectric layer 20 may be used to provide the etch back of the fin 16. The height of the fin 16 is shortened by the etch back relative to the height of the fins 14, 15.

Energetic ions, as indicated diagrammatically by the single-headed arrows 38, are introduced into the fin 16, which has a height that is shortened by the etch-back. In an embodiment, the ions 38 may deliver an n-type dopant selected from Group V of the Periodic Table (e.g., arsenic (Ar) or phosphorus (P)) in a concentration effective to impart n-type conductivity to the semiconductor material of the fin 16. The ions 38 may be generated from a suitable source gas and implanted with selected implantation conditions (e.g., ion species, dose, kinetic energy) using an ion implantation tool. Dopant may be introduced into the entire height of the fin 16 such that the fin 16 provides a selectively implanted collector of a bipolar junction transistor. The fins 14, 15 are covered by the block mask 36 and are not implanted with a dose of the ions 38.

Figure 5:
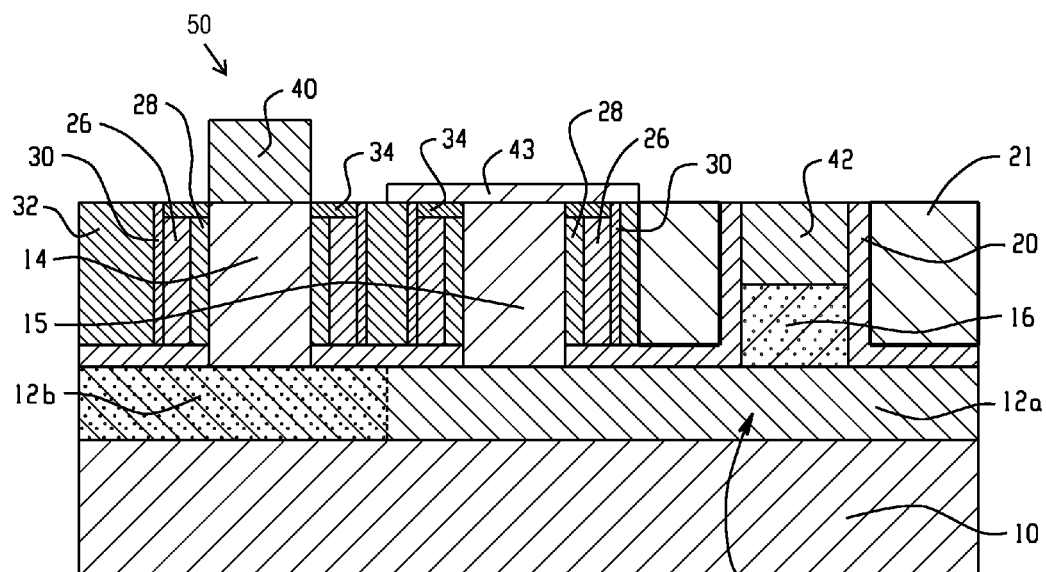

With reference to FIG. 5 in which like reference numerals refer to like features in FIG. 4 and at a subsequent fabrication stage, the block mask 36 is removed, and sections 40, 42 of an epitaxial layer are respectively formed on the top surface of the fin 14 and the recessed top surface of the fin 16. The layer sections 40, 42 may be comprised of a single-crystal semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent, grown by an epitaxial growth process. The germanium content of the layer sections 40, 42 may be uniform across the layer thickness, or may be graded and/or stepped across the layer thickness. In an embodiment, the layer sections 40, 42 may be formed by a selective epitaxial growth (SEG) process in which semiconductor material nucleates for epitaxial growth on semiconductor surfaces, but does not nucleate for epitaxial growth from insulator surfaces. The layer sections 40, 42 may comprise a dopant, such as a p-type dopant (e.g., boron) selected from Group III of the Periodic Table in a concentration that is effective to impart p-type conductivity to the constituent semiconductor material.

The layer section 40 on the top surface of fin 14 provides a source/drain region of a p-type vertical field-effect transistor 50 formed using fin 14. The section 12b of the epitaxial layer 12 provides the semiconductor material for the other source/drain region of the p-type vertical field-effect transistor 50, and the fin 14 and its associated gate electrode 22 are vertically located between these source/drain regions. The layer section 42 on the top surface of fin 16 provides a base of the bipolar junction transistor being formed using fin 16. The top surface of fin 15 is temporarily covered by a protect layer 43 during the growth of the layer sections 40, 42.

Figure 6:
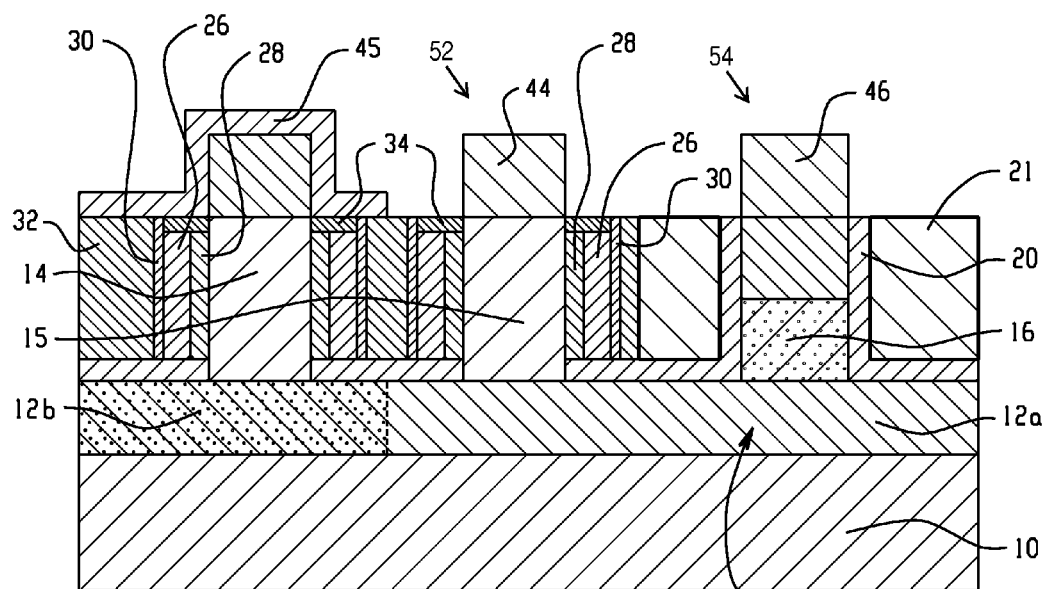

With reference to FIG. 6 in which like reference numerals refer to like features in FIG. 5 and at a subsequent fabrication stage, sections 44, 46 of an epitaxial layer are respectively formed on the top surface of the fin 15 and the top surface of the layer section 42 on the fin 16. The layer sections 44, 46 may be comprised of a single-crystal semiconductor material, such as silicon (Si), grown by an epitaxial growth process. In an embodiment, the layer sections 44, 46 may be formed by a selective epitaxial growth (SEG) process in which semiconductor material nucleates for epitaxial growth on semiconductor surfaces, but does not nucleate for epitaxial growth from insulator surfaces. The layer sections 44, 46 may comprise a dopant, such as an n-type dopant from Group V of the Periodic Table (e.g., phosphorus (P) or arsenic (As)) in a concentration that is effective to impart n-type conductivity to the constituent semiconductor material.

The layer section 44 on the top surface of fin 15 provides a source/drain region of an n-type vertical field-effect transistor 52 formed using fin 15. The section 12a of the epitaxial layer 12 provides the semiconductor material for the other source/drain region of the n-type vertical field-effect transistor 52, and the fin 14 and its associated gate electrode 22 are vertically located between these source/drain regions. The layer section 46 on the top surface of fin 16 provides an emitter of the bipolar junction transistor 54 formed using fin 16. The layer section 40 on the top surface of fin 14 is temporarily covered by a protect layer 45 during the growth of the layer sections 44, 46.

Middle-of-line (MOL) processing and back-end-of-line (BEOL) processing follow, which includes formation of contacts and wiring for a MOL local interconnect structure, and formation of dielectric layers, via plugs, and wiring for a BEOL interconnect structure coupled by the MOL local interconnect structure with the p-type vertical field-effect transistor 50, the n-type vertical field-effect transistor 52, and the bipolar junction transistor 54.

Figure 7:
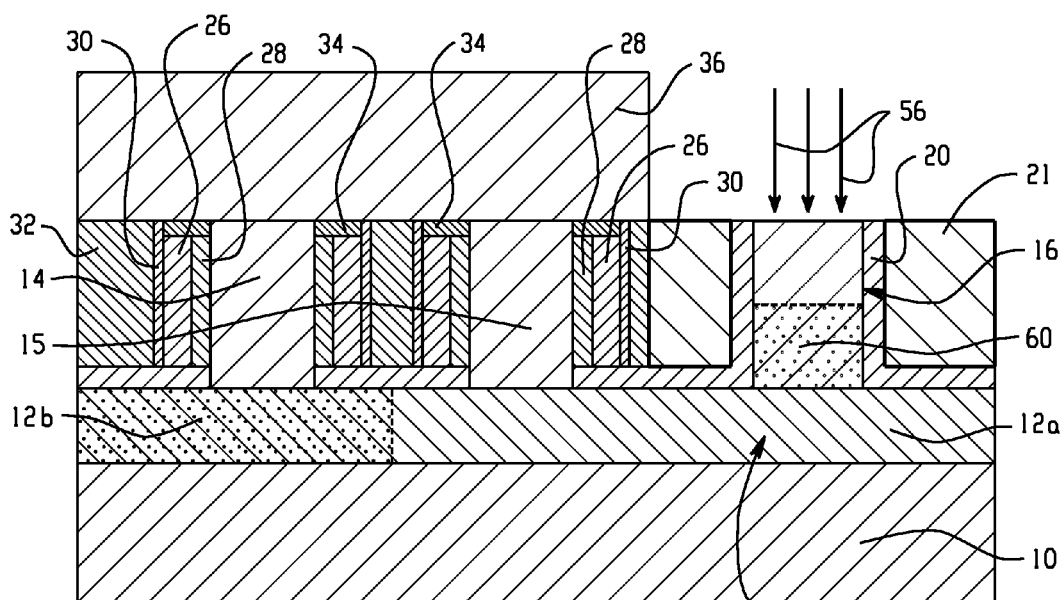
FIGS. 7-9 are cross-sectional views of a portion of a substrate at successive fabrication stages of a processing method for fabricating device structures in accordance with embodiments of the invention.

With reference to FIG. 7 in which like reference numerals refer to like features in FIG. 3 and at a subsequent fabrication stage in accordance with alternative embodiments of the invention, the fin 16 is not recessed and energetic ions 56 are introduced into the full-height fin 16. In an embodiment, the ions 56 may deliver an n-type dopant selected from Group V of the Periodic Table (e.g., arsenic (As) or phosphorus (P)) in a concentration effective to impart n-type conductivity to the semiconductor material of the fin 16. The fins 14, 15 are covered by the block mask 36 and are not implanted. Dopant may be introduced into the lower section 60 of the fin 16 and over only a portion of its height such that the implanted portion of the fin 16 provides a selectively implanted collector of a bipolar junction transistor.

Figure 8:
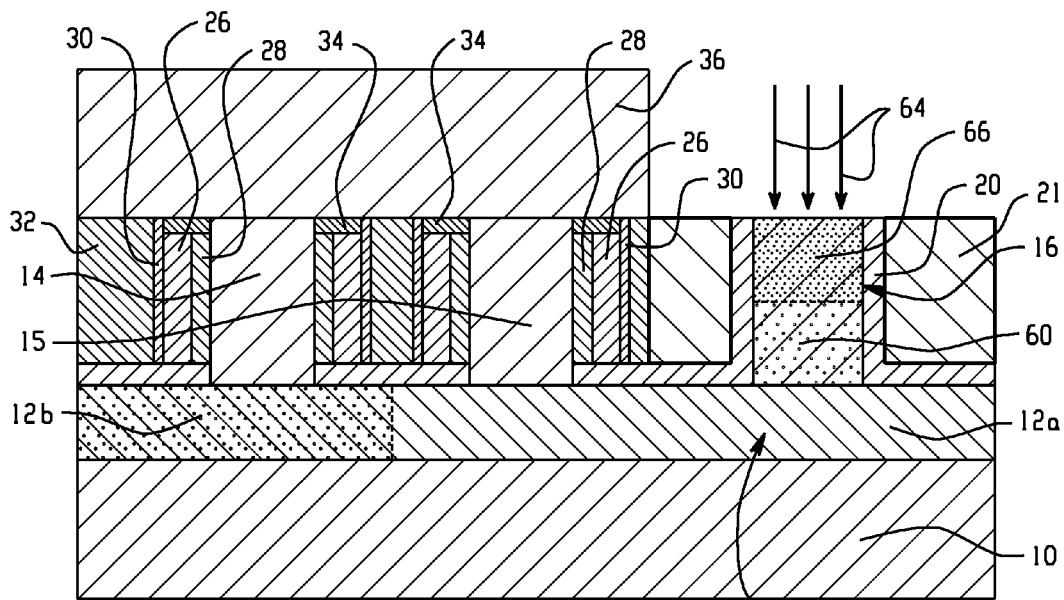

With reference to FIG. 8 in which like reference numerals refer to like features in FIG. 7 and at a subsequent fabrication stage, energetic ions, as indicated diagrammatically by the single-headed arrows 64, are introduced into an upper section 66 of the fin 16. In an embodiment, the ions 64 may deliver a p-type dopant (e.g., boron) selected from Group III of the Periodic Table in a concentration that is effective to impart p-type conductivity to the constituent semiconductor material of the fin 16. The ions 64 may be generated from a suitable source gas and implanted with selected implantation conditions (e.g., ion species, dose, kinetic energy) using an ion implantation tool. Dopant may be introduced into the upper section 66 of the fin 16 such that the upper section 66 provides a base of a bipolar junction transistor. The fins 14, 15 are covered by the block mask 36 and are not implanted.

Figure 9:
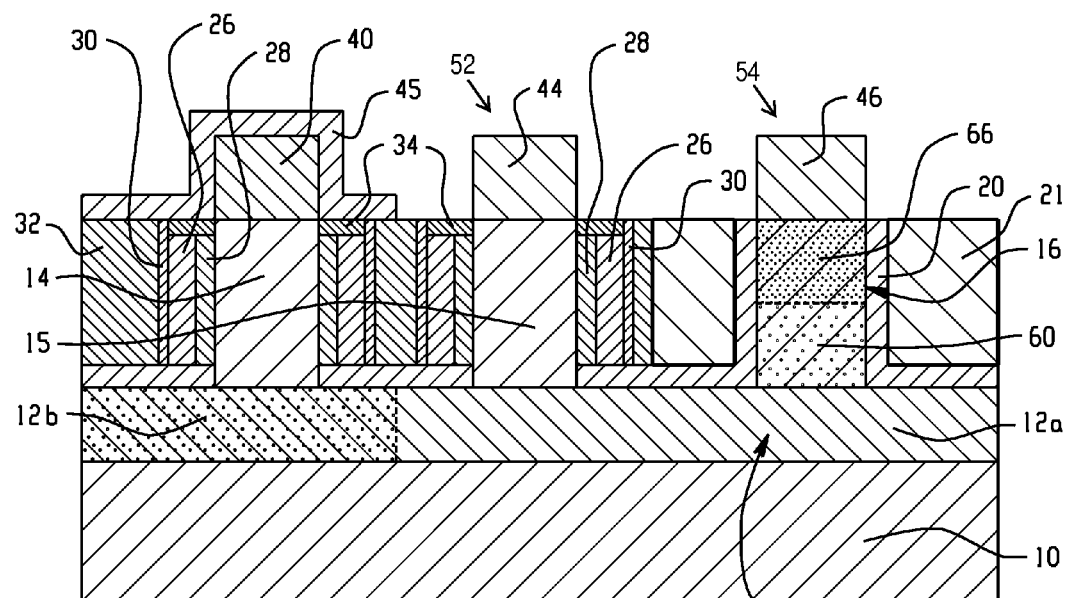

With reference to FIG. 9 in which like reference numerals refer to like features in FIG. 8 and at a subsequent fabrication stage, the section 40 of the epitaxial layer is formed on the top surface of the fin 14 as described above in the context of FIG. 5. The top surface of fin 15 and the top surface of fin 16 are covered by the protect layer 43 during the growth of the layer section 40, and layer section 42 is therefore not formed on fin 16. The layer section 40 on the top surface of fin 14 provides the source/drain region of the p-type vertical field-effect transistor 50 formed using fin 14.

The sections 44, 46 of the epitaxial layer are respectively formed on the top surface of the fin 15 and the top surface of the layer section 42 on the fin 16. The layer sections 44, 46 may be comprised of a single-crystal semiconductor material, such as silicon (Si), grown by an epitaxial growth process. In an embodiment, the layer sections 44, 46 may be formed by a selective epitaxial growth (SEG) process in which semiconductor material nucleates for epitaxial growth on semiconductor surfaces, but does not nucleate for epitaxial growth from insulator surfaces. The layer sections 44, 46 may comprise a dopant, such as an n-type dopant from Group V of the Periodic Table (e.g., phosphorus (P) or arsenic (As)) in a concentration that is effective to impart n-type conductivity to the constituent semiconductor material.

The layer section 44 on the top surface of fin 15 provides a source/drain region of the n-type vertical field-effect transistor 52 formed using fin 15. The section 12a of the epitaxial layer 12 provides the semiconductor material for the other source/drain region of the n-type vertical field-effect transistor 52, and the fin 14 and its associated gate electrode 22 are vertically located between these source/drain regions. The layer section 46 on the top surface of fin 16 provides an emitter of the bipolar junction transistor 54 formed using fin 16. The layer section 40 on the top surface of fin 14 is temporarily covered by the protect layer 45 during the growth of the layer sections 44, 46.

Middle-of-line (MOL) processing and back-end-of-line (BEOL) processing follow to form a MOL local interconnect structure and a BEOL interconnect structure coupled by the MOL local interconnect structure with the p-type vertical field-effect transistor 50, the n-type vertical field-effect transistor 52, and the bipolar junction transistor 54.

Figure 10:
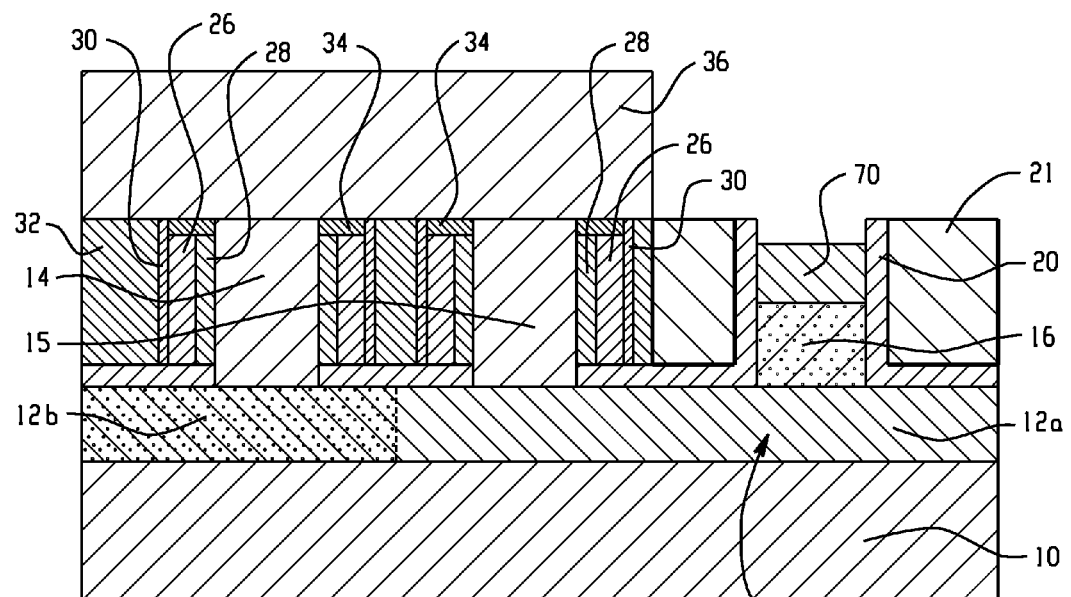
FIGS. 10 and 11 are cross-sectional views of a portion of a substrate at successive fabrication stages of a processing method for fabricating device structures in accordance with embodiments of the invention.

With reference to FIG. 10 in which like reference numerals refer to like features in FIG. 4 and at a subsequent fabrication stage in accordance with alternative embodiments of the invention, a section 70 of an epitaxial layer is formed only on the recessed top surface of the fin 16. The layer section 70 may be comprised of a single-crystal semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent, grown by an epitaxial growth process. The germanium content of the layer section 70 may be uniform across the layer thickness, or may be graded and/or stepped across the layer thickness. In an embodiment, the layer section 70 may be formed by a selective epitaxial growth (SEG) process in which semiconductor material nucleates for epitaxial growth on semiconductor surfaces, but does not nucleate for epitaxial growth from insulator surfaces. The layer section 70 may comprise a dopant, such as a p-type dopant (e.g., boron) selected from Group III of the Periodic Table in a concentration that is effective to impart p-type conductivity to the constituent semiconductor material.

The layer section 70 on the top surface of fin 16 provides a base of the bipolar junction transistor being formed using fin 16. Fin 14 and fin 15 are covered by the block mask 36 during the epitaxial growth of the layer section 70. Due to the formation of the base of the bipolar junction transistor 54 independent of the source/drain region of the p-type vertical field-effect transistor 50, greater control can be exerted over the composition and height of the layer section 70. For example, the layer section 70 is not constrained to have the same boron content and/or germanium content as the layer section 40 providing the source/drain region of the p-type vertical field-effect transistor 50. As another example, the layer section 70 is not constrained to have a height tied to the height of the layer section 40 because different depositions are used to epitaxially grow layer section 40 and layer section 70.

Figure 11:
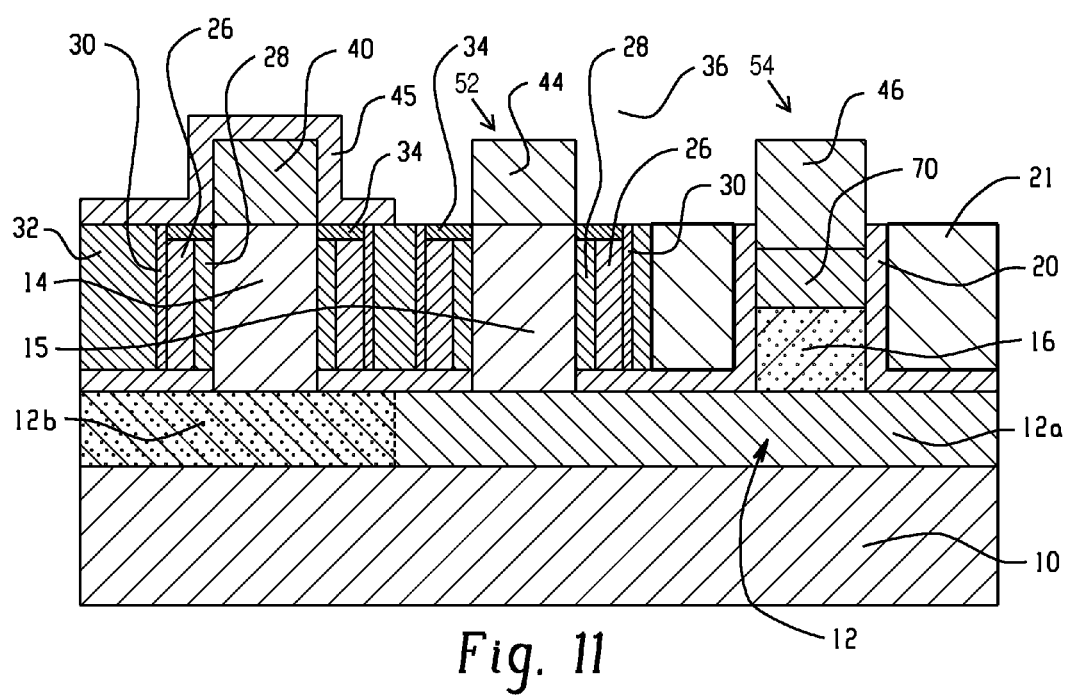

With reference to FIG. 11 in which like reference numerals refer to like features in FIG. 10 and at a subsequent fabrication stage, the block mask 36 is removed, and the section 40 of the epitaxial layer is formed on the top surface of the fin 14 as described in the context of FIG. 5. The protect layer 43 temporarily covers the top surface of fin 15 and the layer section 70 on fin 16 during the growth of layer section 40 and the layer section 42 is therefore not formed. The layer section 40 on the top surface of fin 14 provides a source/drain region of a p-type vertical field-effect transistor 50 formed using fin 14. The section 12b of the epitaxial layer 12 provides the semiconductor material for the other source/drain region of the p-type vertical field-effect transistor 50, and the fin 14 and its associated gate electrode 22 are vertically located between these source/drain regions.

The sections 44, 46 of the epitaxial layer are respectively formed on the top surface of the fin 15 and the top surface of the layer section 70 on the fin 16. The layer sections 44, 46 may be comprised of a single-crystal semiconductor material, such as silicon (Si), grown by an epitaxial growth process. In an embodiment, the layer sections 44, 46 may be formed by a selective epitaxial growth (SEG) process in which semiconductor material nucleates for epitaxial growth on semiconductor surfaces, but does not nucleate for epitaxial growth from insulator surfaces. The layer sections 44, 46 may comprise a dopant, such as an n-type dopant from Group V of the Periodic Table (e.g., phosphorus (P) or arsenic (As)) in a concentration that is effective to impart n-type conductivity to the constituent semiconductor material.

The layer section 44 on the top surface of fin 15 provides a source/drain region of the n-type vertical field-effect transistor 52 formed using fin 15. The section 12a of the epitaxial layer 12 provides the semiconductor material for the other source/drain region of the n-type vertical field-effect transistor 52, and the fin 14 and its associated gate electrode 22 are vertically located between these source/drain regions. The layer section 46 on the top surface of fin 16 provides the emitter of the bipolar junction transistor 54 formed using fin 16. The layer section 40 on the top surface of fin 14 is temporarily covered by a protect layer 45 during the growth of the layer sections 44, 46.

Middle-of-line (MOL) processing and back-end-of-line (BEOL) processing follow to form a MOL local interconnect structure and a BEOL interconnect structure coupled by the MOL local interconnect structure with the p-type vertical field-effect transistor 50, the n-type vertical field-effect transistor 52, and the bipolar junction transistor 54.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first fin and a second fin on a semiconductor substrate;
   forming a gate electrode of a first vertical field-effect transistor in association with the first fin;
   after forming the gate electrode of the first vertical field-effect transistor, forming a base of a bipolar junction transistor on the second fin with a first epitaxial growth process; and
   after forming the base of the bipolar junction transistor on the second fin with the first epitaxial growth process, concurrently forming, with a second epitaxial growth process, an emitter of the bipolar junction transistor on the base and a first source/drain region of the first vertical field-effect transistor on the first fin,
   wherein the gate electrode and the first fin are arranged in a vertical direction between the first source/drain region and the semiconductor substrate, and the second fin is arranged in the vertical direction between the emitter and the semiconductor substrate.

2. The method of claim 1 further comprising:
   implanting the second fin to form a selectively implanted collector.

3. The method of claim 2 wherein the selectively implanted collector is formed before the emitter is formed with the second epitaxial growth process.

4. The method of claim 2 wherein the base of the bipolar junction transistor is epitaxially grown on the second fin after the selectively implanted collector is formed.

5. The method of claim 2 further comprising:
   recessing the second fin relative to the first fin before the selectively implanted collector is formed.

6. The method of claim 1 further comprising:
   forming a third fin on the semiconductor substrate;
   forming a gate electrode of a second vertical field-effect transistor in association with the third fin; and
   forming, with the first epitaxial growth process, a source/drain region of the second vertical field-effect transistor on the third fin,
   wherein the source/drain region of the second vertical field-effect transistor on the third fin is concurrently formed with the base of the bipolar junction transistor.

7. The method of claim 1 further comprising:
   forming a third fin on the semiconductor substrate;
   forming a gate electrode of a second vertical field-effect transistor in association with the third fin; and
   masking the third fin when the base of the bipolar junction transistor is formed by the first epitaxial growth process.

8. The method of claim 7 further comprising:
   forming, with a third epitaxial growth process, a second source/drain region of the second vertical field-effect transistor on the third fin, wherein the base is comprised of a first semiconductor material, and the second source/drain region is comprised of a second semiconductor material that is different from the first semiconductor material.

9. The method of claim 8 wherein the first semiconductor material is composed of silicon germanium, and the second semiconductor material is composed of silicon germanium with a different germanium content than the first semiconductor material.

10. The method of claim 8 wherein the first semiconductor material is composed of silicon germanium, and the second semiconductor material is composed of silicon germanium with a different dopant content than the first semiconductor material.

11. The method of claim 1 further comprising:
implanting the second fin to form a selectively implanted collector before the base and the emitter are formed.

12. The method of claim 1 further comprising:
recessing the second fin relative to the first fin before the base and the emitter are formed.

13. The method of claim 1 wherein the second epitaxial growth process is a selective epitaxial growth process.

14. A method comprising:
forming a first fin and a second fin on a semiconductor substrate;
forming a gate electrode of a vertical field-effect transistor in association with the first fin;
after forming the gate electrode of the first vertical field-effect transistor, implanting the second fin to form a base of the bipolar junction transistor;
after implanting the second fin to form the base of the bipolar junction transistor, concurrently forming, with an epitaxial growth process, an emitter of the bipolar junction transistor on the second fin and a first source/drain region of the first vertical field-effect transistor on the first fin,
wherein the gate electrode and the first fin are arranged in a vertical direction between the first source/drain region and the semiconductor substrate, and the second fin is arranged in the vertical direction between the emitter and the semiconductor substrate.

15. The method of claim 14 further comprising:
implanting the second fin to form a selectively implanted collector before the base and the emitter are formed.

16. The method of claim 15 wherein the selectively implanted collector in the second fin is located in the vertical direction between the base and the semiconductor substrate.

17. The method of claim 15 wherein the bipolar junction transistor includes a collector in the semiconductor substrate, and the selectively implanted collector couples the base with the collector.

18. The method of claim 15 wherein the selectively implanted collector and the base are comprised of semiconductor materials with opposite conductivity types.

19. The method of claim 14 wherein the epitaxial growth process is a selective epitaxial growth process.

* * * * *